United States Patent [19]

Gerstle et al.

[11] 4,409,306

[45] Oct. 11, 1983

[54] METHOD OF PREPARING A PHOSPHOR SUSPENSION

[75] Inventors: Volker Gerstle, Wendlingen; Gerhard Mauz, Köngen; Rolf Zondler, Stuttgart, all of Fed. Rep. of Germany

[73] Assignee: International Standard Electric Corporation, New York, N.Y.

[21] Appl. No.: 355,018

[22] Filed: Mar. 2, 1982

[30] Foreign Application Priority Data

Mar. 18, 1981 [DE] Fed. Rep. of Germany ....... 3110476

[51] Int. Cl.³ .................................................. G03C 1/66
[52] U.S. Cl. ..................................... 430/28; 430/274; 430/289; 430/909; 430/913; 252/301.36; 252/301.4 R
[58] Field of Search .................. 430/28, 23, 289, 909, 430/913, 274; 427/54.1; 252/301.36, 301.4 R

[56] References Cited

U.S. PATENT DOCUMENTS

| | | | |
|---|---|---|---|
| 2,025,996 | 12/1935 | Maillet | 430/289 |
| 3,102,030 | 8/1963 | Hoerner | 430/274 |
| 3,366,481 | 1/1968 | Lalone | 430/289 |
| 3,615,458 | 10/1971 | Dykstra | 430/274 |
| 3,673,962 | 7/1972 | Sagawa | 430/289 |
| 3,676,177 | 7/1972 | Hammond et al. | 430/28 |
| 4,028,114 | 6/1977 | Viohl | 430/289 |

Primary Examiner—J. Travis Brown
Attorney, Agent, or Firm—John T. O'Halloran

[57] ABSTRACT

Method of preparing a phosphor suspension by mixing a photosensitive material, a photosensitizer, and a phosphor for the purpose of forming a photosensitive film. The photosensitizer in the suspension is a chromic-acid solution.

With such a phosphor suspension, a firmly adhering, uniform and compact phosphor film can be formed on the screen substrate. In addition, the phosphor areas obtained by this method have very sharp boundaries.

5 Claims, No Drawings

METHOD OF PREPARING A PHOSPHOR SUSPENSION

The present invention relates to a method of preparing a phosphor suspension by mixing a photosensitive material, a photosensitizer, and a phosphor for the purpose of forming a photosensitive film.

Screens for color-picture tubes and vacuum-fluorescent displays are commonly fabricated by mixing a photosensitive material and a photosensitizer, dispersing a phosphor into the liquid mixture so obtained, and applying this suspension to the inside surface of a screen substrate. The film thus obtained is then dried, exposed through the apertures of a shadow mask or through a photomask and developed. By this method, a regular array of phosphor dots or stripes is obtained. To form a three-color screen, each of the above steps is repeated for the other two colors.

According to DE-AS No. 21 62 886, for example, the photosensitizer used in the suspension for forming the photosensitive film is dichromate. This has the disadvantage that the exposure time for producing phosphor layers of predetermined thickness are very long, i.e., that the sensitivity to light is still low. Particularly in vacuum-fluorescent displays, the uniformity, compactness, adherence, and resolution characteristics of the phosphor layers are quite unsatisfactory.

Accordingly, the object of the invention is to provide a method of producing improved phosphor layers on a screen and particularly to improve the adherence and edge definition of the phosphor areas. According to the invention, the photosensitizer in the phosphor suspension for forming the photosensitive film is a chromic-acid solution.

The phosphor suspension thus obtained is applied to the screen substrate, and the light-sensitive film is then dried, exposed, and developed.

The percentage by weight of chromic-acid solution in the suspension is advantageously 0.1–15% and preferably 5–10%.

To achieve good adherence and good resolution characteristics of the phosphor film on the screen substrate, it was found advantageous to first mix the solution of the photosensitive material with the chromic-acid solution and then place the phosphor in suspension therein.

The photosensitive material used is preferably a polyvinyl alcohol.

The method according to the invention is suited to improving the adherence and resolution characteristics of phosphors not only in color-picture tubes of any size but also in vacuum-fluorescent displays.

In color-picture tubes, the method according to the invention is suitable for both small and great mask-to-screen distances.

The method according to the invention will now be explained in more detail with the aid of the following example of the fabrication of a vacuum-fluorescent display.

EXAMPLE

To form an advantageous film, a suspension of 4 grams of polyvinyl alcohol (10% by weight), 0.24 grams of $CrO_3$ solution (8% by weight), 42 grams of phosphor, and 18 grams of demineralized water is prepared.

This suspension is deposited on the inside surface of a screen substrate. The phosphor film so formed is dried, exposed, and developed in the known manner.

The phosphor areas thus obtained, which are 5–30 $\mu$m thick, adhere firmly to the screen substrate, are very uniform and compact, and have sharp boundaries. Exposure time is reduced as compared to the prior art: If the photosensitizer is potassium dichromate, the exposure time is 35–40 s, while the use of a chromic-acid solution reduces the exposure time to 10–15 s for the same thickness of the phosphor film. This means that the sensitivity to light is greatly increased.

The principal advantages of the invention are that firmly adhering, uniform and compact phosphor films can be formed on the screen substrate, and that the phosphor areas thus obtained have very sharp boundaries.

I claim:

1. Method of preparing a phosphor suspension by mixing a photosensitive material, a photosensitizer, and a phosphor for the purpose of forming a photosensitive film, characterized in that the photosensitizer in the suspension is a chromic-acid solution.

2. A method as claimed in claim 1, characterized in that the percentage by weight of chromic-acid solution in the suspension is 0.1–15%.

3. A method as claimed in claim 2, characterized in that the percentage by weight of chromic-acid solution in the suspension is preferably 5–10%.

4. A method as claimed in claim 1, characterized in that the photosensitive material and the chromic-acid solution are mixed before the phosphor is added.

5. A method as claimed in claim 1 or 4, characterized in that the photosensitive material is polyvinyl alcohol.

* * * * *